US007388418B2

(12) United States Patent
Reffay

(10) Patent No.: US 7,388,418 B2
(45) Date of Patent: Jun. 17, 2008

(54) CIRCUIT FOR GENERATING A FLOATING REFERENCE VOLTAGE, IN CMOS TECHNOLOGY

(75) Inventor: Marius Reffay, Grenoble (FR)

(73) Assignee: STMicroelectronics S.A., Montrouge (FR)

( * ) Notice: Subject to any disclaimer, the term of this patent is extended or adjusted under 35 U.S.C. 154(b) by 142 days.

(21) Appl. No.: 11/337,818

(22) Filed: Jan. 23, 2006

(65) Prior Publication Data

US 2006/0176086 A1 Aug. 10, 2006

(30) Foreign Application Priority Data

Feb. 8, 2005 (FR) .................................. 05 01233

(51) Int. Cl.
*H01L 35/00* (2006.01)

(52) U.S. Cl. ..................................................... 327/513

(58) Field of Classification Search ................ 327/513, 327/534, 535, 537, 539
See application file for complete search history.

(56) References Cited

U.S. PATENT DOCUMENTS 5,034,626 A * 7/1991 Pirez et al. ................. 327/542
5,604,427 A * 2/1997 Kimura ....................... 323/313
5,818,294 A * 10/1998 Ashmore, Jr. ............... 327/543
6,107,868 A 8/2000 Diniz et al.
6,522,117 B1 * 2/2003 Young et al. ............... 323/315
6,563,295 B2 * 5/2003 Juang .......................... 323/315
6,664,847 B1 12/2003 Ye
6,987,416 B2 * 1/2006 Ker et al. ................... 327/539
7,078,958 B2 * 7/2006 Gower et al. ............... 327/539
2004/0155700 A1 8/2004 Gower et al.

FOREIGN PATENT DOCUMENTS

EP 0 778 509 6/1997

OTHER PUBLICATIONS

Preliminary French Search Report, FR 05 01233, dated Oct. 7, 2005.

* cited by examiner

*Primary Examiner*—Jeffrey S Zweizig
(74) *Attorney, Agent, or Firm*—Gardere Wynne Sewell LLP

(57) ABSTRACT

A circuit generates a reference voltage that is independent of temperature. The circuit is built on a substrate according to a CMOS technology, and includes a first stage for generating a first current proportional to temperature and a second stage for generating a second current inversely proportional to temperature. These first and second currents are summed in a resistor connected to a voltage distinct from the ground of the first and second stages and formed by the voltage of the substrate on which the circuit is built.

18 Claims, 3 Drawing Sheets

CIRCUIT FOR GENERATING A FLOATING REFERENCE VOLTAGE, IN CMOS TECHNOLOGY

PRIORITY CLAIM

The present application claims priority from French Application for Patent No. 05 01233 filed Feb. 8, 2005, the disclosure of which is hereby incorporated by reference.

BACKGROUND OF THE INVENTION

1. Technical Field of the Invention

The present invention relates to voltage references and relates, more particularly, to a circuit for generating such a reference voltage.

2. DESCRIPTION OF RELATED ART

Accurate and stable reference voltages, in other words mostly independent of temperature, but also power supply voltages, are essential circuits for analog integrated circuits. In fact, the operational characteristics of active analog circuits are determined by the values of the reference voltages that they use. This is particularly the case for analog-digital or digital-analog conversion circuits whose resolution is directly linked to the stability of the reference voltage used in performing the conversion.

Today, various techniques exist for generating a stable reference voltage. As an example, reference could be made to the reference voltage generation circuits based on the principle of the bandgap energy, commonly denoted by those skilled in the art as bandgap reference circuits.

As can be seen in FIG. 1, which shows the general principle of such a circuit, the independence of the reference voltage with respect to temperature variations is based on the use of two diodes D1 and D2 which have different active areas and through which the same current flows. The cathode C of each diode is connected to the substrate Sub. The two diodes D1 and D2 are installed in two respective branches B1 and B2 of the circuit. These two branches are supplied by a voltage Vdd via an MOS transistor M1. A first branch, namely the branch denoted by the reference B1, has two resistors R1 and R3 placed in series between the source of the MOS transistor M1 and the anode of the diode D1. The second branch B2 has a resistor R2 identical to the resistor R1. An operational amplifier A imposes an identical voltage level between a first node N1 situated between the resistors R1 and R3 of the first branch B1 and a node N2 of the second branch B2 situated between the resistor R2 and the anode of the diode D2.

The resistors R1 and R2 are identical. As previously indicated, and by reason of the presence of the operational amplifier A, the currents flowing in the branches B1 and B2 are identical. The voltage equality between the nodes N1 and N2 imposes that:

$$I \times R3 + \frac{KT}{q}\ln\frac{I}{IS1} = \frac{KT}{q}\ln\frac{I}{IS2} \quad (1)$$

in which:

K denotes Boltzmann's constant q is the charge on an electron

T is the operating temperature of the circuit in degrees K, and

IS1 and IS2 respectively denote the saturation currents of the diodes D1 and D2.

This equation implies that:

$$I = \frac{1}{R3} \times \frac{KT}{q}\ln\alpha \quad (2)$$

in which α is the ratio of the areas of the diodes D1 and D2.

The reference voltage delivered by this circuit is therefore given by the equation:

$$Vref = \frac{R2}{R3} \times \frac{KT}{q}\ln\alpha + Vd2 \quad (3)$$

where Vd2 denotes the voltage across the terminals of the diode D2.

This equation (3) shows that the reference voltage may be considered as made up of the sum of two terms. One is proportional to temperature, whereas the diode voltage Vd2 is inversely proportional to it. By judiciously choosing the ratio R2/R3, a reference voltage that is virtually independent of temperature can be obtained.

However, as is known, in CMOS technology, diodes are fabricated using a base-emitter junction of a bipolar transistor. Such a transistor has a low gain. In addition, the collector is referenced to the circuit substrate. Thus, it will be understood that this type of circuit exhibits a certain number of major drawbacks, notably owing to the fact that, in the case where the substrate is affected by low- or high-frequency stray currents, these stray currents can propagate as far as the output of the circuit and affect the reference voltage level. In any case, the reference voltage is defined with respect to the substrate voltage, such that any voltage variation within the substrate results in a corresponding variation in the reference voltage.

This drawback can be redhibitory when it is desired to control a display screen of the LCD (Liquid Crystal Display) type in which the analog signals of the red, green and blue inputs are transformed into digital signals which are subsequently processed by algorithms designed for addressing the LCD matrices. The synchronization is effected using line synchronization pulses, either on a rising edge or on a falling edge. This pulse is relatively distorted, but the synchronization triggering must occur on very reproducible levels, whatever the temperature or the variations in power supply voltage. Moreover, the digital CMOS circuits used to control the LCD display screen tend to generate significant switching noise on the substrate. The synchronization is therefore effected by using hysteresis comparators with thresholds that are as independent as possible both of temperature and of the supply voltages.

In view of the above, there is a need to provide a reference voltage that is independent of temperature, but also of the voltage of the substrate on which the reference voltage generation circuit is built.

SUMMARY OF THE INVENTION

The subject of the invention is therefore a circuit for generating a reference voltage that is independent of temperature, which is built on a substrate according to a CMOS technology, and which comprises a first stage for generating a first current proportional to temperature and a second stage for generating a second current inversely proportional to temperature, and means for summing the first and second currents in a resistor connected to a voltage distinct from and electrically independent of the ground of the first and second stages, formed by the voltage of the substrate on which the circuit is built.

In one embodiment, the first stage comprises two parallel circuit branches in which the same current flows, a first circuit branch comprising a first diode and a second circuit branch comprising a second diode and a resistor connected in series.

For example, the first and second diodes are each formed by a base-emitter junction of a bipolar transistor.

According to another feature of the invention, the circuit also comprises a current mirror circuit that imposes the same current in each of the branches.

The branches respectively comprise a first and a second MOS transistor that are identical, one being connected between the current mirror and the first diode and the other between the current mirror and the resistor so as to impose an identical potential difference between, on the one hand, the first diode and, on the other, the second diode and the resistor, the first current proportional to temperature being formed by the current imposed in the resistor by the effect of the voltage variations proportional to temperature across the terminals of the second diode.

According to yet another feature of the invention, the diodes have different active areas.

Regarding the second stage, this comprises feedback means for controlling the voltage across the terminals of a third resistor with respect to a voltage across the terminals of a third diode relative to the substrate voltage, the second current inversely proportional to temperature being formed by the current flowing through the resistor.

For example, the first and the second currents are sampled by means of a current mirror circuit.

In one embodiment, this circuit additionally comprises a starter circuit.

In accordance with an embodiment of the invention, a circuit comprises a current mirror circuit including a first and second branches connected between a reference voltage and a substrate voltage and through which substantially identical currents flow, each first and second branch including a diode, the diodes having differing area coefficients, the current mirror circuit producing a first output current which is a copy of the current mirror branch current, a current source circuit including first and second branches connected between the reference voltage and the substrate voltage, the first branch including a diode and the second branch including a resistor, the current source circuit generating a current in the second branch that is dependent on a voltage across the diode and a value of the resistor, the current source circuit producing a second output current which is a copy of the second branch current, and a summing circuit to sum the first and second output currents.

In accordance with another embodiment, a circuit fabricated on a semiconductor substrate comprises a first circuit coupled between a supply voltage and a substrate voltage, the first circuit operable to produce a first output current proportional to temperature and independent of the supply voltage and substrate voltage, a second circuit coupled between the supply voltage and substrate voltage, the first circuit operable to produce a second output current inversely proportional to temperature and independent of the supply voltage and substrate voltage, and a summing circuit to sum the first and second output currents

BRIEF DESCRIPTION OF THE DRAWINGS

A more complete understanding of the method and apparatus of the present invention may be acquired by reference to the following Detailed Description when taken in conjunction with the accompanying Drawings wherein.

DETAILED DESCRIPTION OF THE PREFERRED EMBODIMENTS

Figure 1:
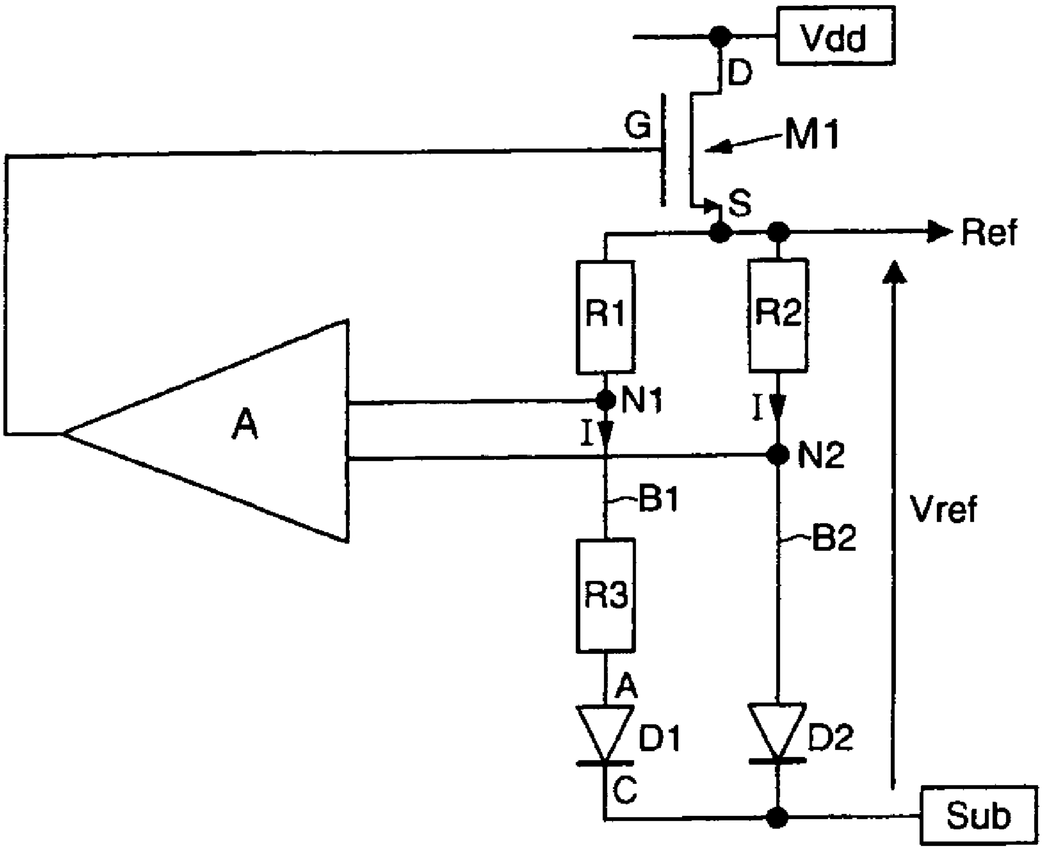
FIG. 1, which has already been mentioned, illustrates the general architecture of a reference voltage generator circuit according to the prior art.
Figure 2:
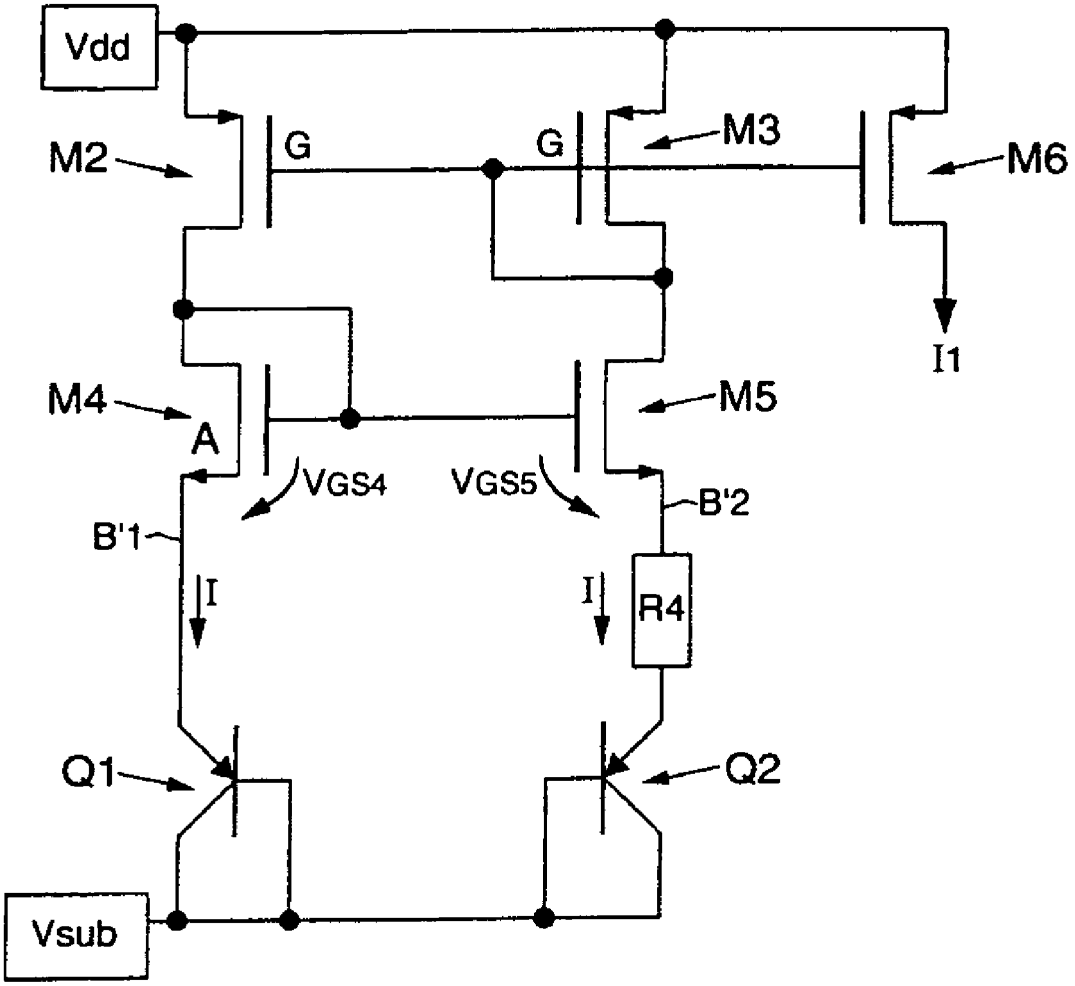
FIG. 2 shows the first stage circuit for generating the current proportional to temperature.
Figure 3:
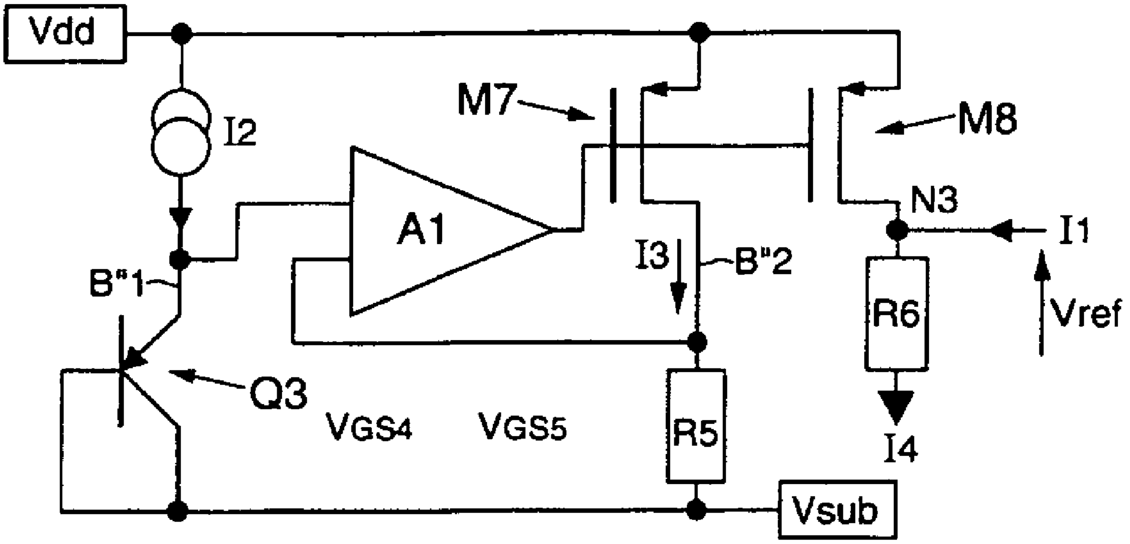
FIG. 3 shows the second stage circuit for generating the second current inversely proportional to temperature.

In FIGS. 2 and 3, the first and second stages of a reference voltage generation circuit according to the invention are shown. These stages are respectively designed to deliver a current proportional to temperature and a current proportional to a voltage from a diode formed by the p-n junction of a bipolar transistor, in other words a voltage inversely proportional to temperature.

First of all, with reference to FIG. 2, the composition of the first stage for generating the current proportional to temperature will be described.

This first circuit is based on the use of two diodes, with different area coefficients and which then have a given area ratio α, through which identical currents flow. As an equivalent variant, two different currents could be made to flow through the diodes having the same area coefficient.

As can be seen in FIG. 2, the two diodes are each formed by the p-n junction of a pnp transistor, Q1, Q2, whose base and collector are set at the substrate voltage Vsub.

These transistors Q1 and Q2 are respectively built into two branches B'1 and B'2 of the circuit which runs between a power supply voltage Vdd and the substrate. They are associated with a current mirror circuit formed by the association of two MOS transistors M2 and M3, whose source is supplied by the voltage Vdd, the gate of one of the transistors being connected to the gate of the other transistor. These transistors are identical and thus exhibit identical voltages Vgs.

In addition, the gates of the transistors M2 and M3 are connected to the drain of the transistor M3.

Thanks to this arrangement, and in particular to the equality of the voltages Vgs, the currents I flowing in the branches B'1 and B'2 are identical.

Furthermore, each branch B'1 and B'2 has third and fourth identical MOS transistors M4 and M5 whose gates are connected together. The drain of the third transistor M4 is connected to the drain of the transistor M2 of the current mirror and the source of this transistor M4 is connected to the emitter of the transistor Q1.

As regards the other branch B'2, the drain of the fourth transistor M5 is connected to the drain of the second transistor M3 of the current mirror circuit, whereas a resistor R4 is interposed between the source of the transistor M5 and the emitter of the transistor Q2.

Finally, it can be seen in FIG. 2 that a fifth transistor M6 is used in order to copy the current proportional to temperature that flows, in particular, in the branch B'2. This is because, as can be seen, the gate of the transistor M6 is connected to the gate of the transistor M3 and the source of this transistor M6 is supplied by the voltage Vdd, the drain of this transistor M6 delivering the current $I_1$ proportional to temperature.

This circuit operates in the following manner.

The transistors M4 and M5 are identical such that the voltage Vgs4 between the gate and the source of the transistor M4 is equal to the voltage Vgs5 between the gate and the source of the transistor M5.

The following equation can therefore be written:

$$V_{BEQ1}+V_{Sub}=V_{BEQ2}+R_4 I+V_{Sub} \tag{4}$$

in which $V_{BEQ1}$ and $V_{BEQ2}$ denote the base-emitter voltages of the transistors Q1 and Q2, respectively.

Therefore:

$$\frac{KT}{q}\ln\frac{I}{I_{SQ_2}}+R_4 I=\frac{KT}{q}\ln\frac{I}{I_{SQ_1}} \tag{5}$$

where $I_{SQ1}$ and $I_{SQ2}$ denote the saturation currents of the diodes formed by transistors $Q_1$ and $Q_2$, respectively.

The current $I_1$ copied is therefore:

$$I_1=\frac{1}{R_4}\frac{KT}{q}\ln\alpha \tag{6}$$

Thus, it can be seen that, thanks to this circuit, neither the voltage Vdd nor the substrate voltage appears in the equation (6) describing the current $I_1$.

However, the circuit shown in FIG. 2 exhibits two stable operating points, one corresponding to a delivered value $I_1$ of zero and the other corresponding to the particular desired value proportional to temperature. An auxiliary starter circuit (not shown) is therefore provided to avoid the circuit being locked onto the operating point corresponding to a current from zero voltage at power up and having no operational mode in the steady-state. Various types of appropriate starter circuits, of the conventional type known to those skilled in the art, may be suitable here for such a starter circuit. For example, such a circuit can be based on the use of a transistor that is suitably biased so as to be turned on when Vgs4=0 and to be turned off when Vgs4 has reached its nominal value.

With reference to FIG. 3, the composition of the second stage for generation of the second current inversely proportional to temperature will now be described.

This circuit also comprises two branches B"1 and B"2 which run between a voltage source Vdd and the substrate voltage Vsub.

The first branch B"1 comprises a current source 12, which supplies a third bipolar pnp transistor Q3 whose base and collector are connected to the substrate potential Vsub and whose emitter is supplied by the current source 12.

Regarding the second branch B"2, this comprises a p-type MOS transistor M7 whose source is supplied by the voltage Vdd and whose drain is set at the potential Vsub via a resistor R5. An operational amplifier A1, whose inverting and non-inverting terminals are respectively connected to the emitter of the transistor Q3 and to the drain of the MOS transistor M7 and whose output is connected to the gate of this transistor M7, imposes that the emitter voltage of the transistor Q3 and the drain voltage of the transistor M7 be equal.

Lastly, an MOS transistor M8, whose source is set at the potential Vdd, whose gate is connected to the gate of the transistor M7 and whose drain is connected to a separate voltage, preferably ground, different from the substrate onto which the generation circuit according to the invention is built, via a resistor R6, allows the current flowing in the second branch D'2 to be copied. This separate voltage or ground originates for example from the external decoupling of the circuit and is only used for the connection to ground of this portion of the circuit. It is not therefore subject to the interference linked to the presence of the stray currents. It can also be seen from FIG. 3 that the common node N3 between the drain of the transistor M8 and the resistor R3 receives the output current $I_1$ from the first stage (FIG. 2).

This circuit operates in the following manner.

As previously indicated, the emitter voltage $V_{BEQ3}$ of the transistor Q3 is equal to the drain voltage of the transistor M7. This can therefore be written as:

$$V_{BEQ3}+V_{sub}=R_5 I_3+V_{sub} \tag{7}$$

in which $I_3$ denotes the current flowing in the second branch B"2.

Therefore:

$$I_3=\frac{V_{BEQ_3}}{R_5} \tag{8}$$

This current $I_3$ is inversely proportional to temperature and independent of the power supply voltage Vdd and of the substrate voltage Vsub.

Therefore, in order to obtain a reference voltage that is temperature stable and independent of the substrate voltage, it suffices to simply sum the currents $I_1$, originating from the first stage, and the current $I_2$, delivered by the second stage at a node N3. This is carried out at the drain of the transistor M8. Thus, a reference voltage Vref that is temperature stable and independent of the power supply voltage Vdd and of the substrate voltage Vsub is recovered at the output, across the terminals of the resistor R6. This voltage thus constitutes a floating reference voltage.

It will be noted that it is also possible to decouple the output with a capacitor of relatively high value in order to keep a suitable efficiency at high frequency where coupling occurs via stray capacitances.

It will finally be noted that the voltage obtained presents a high output impedance. If a low output impedance is desired, a follower amplifier will be added onto the output.

Although preferred embodiments of the method and apparatus of the present invention have been illustrated in the accompanying Drawings and described in the foregoing Detailed Description, it will be understood that the invention is not limited to the embodiments disclosed, but is capable of numerous rearrangements, modifications and substitutions without departing from the spirit of the invention as set forth and defined by the following claims.

What is claimed is:

1. A circuit for generating a reference voltage that is independent of temperature, the circuit being built on a substrate according to a CMOS technology, comprising:

- a first stage for generating a first current proportional to temperature;
- a second stage for generating a second current inversely proportional to temperature, and
- a circuit to sum the first and second currents in a resistor connected to a voltage distinct from and electrically independent of a ground of the first and second stages formed by a voltage of the substrate.

2. The circuit according to claim 1, wherein the first stage comprises two parallel circuit branches in which a same current flows, a first circuit branch comprising a first diode and a second circuit branch comprising a second diode and a resistor connected in series.

3. The circuit according to claim 2, wherein the first and second diodes are each formed by a base-emitter junction of a bipolar transistor.

4. The circuit according to claim 2, further comprising a current mirror circuit that imposes the same current flows in each of the two circuit branches of the first stage.

5. The circuit according to claim 4, further comprising a first and a second MOS transistor that are identical, one being connected between the current mirror and the first diode and the other connected between the current mirror and the resistor so as to impose an identical potential difference across, on the one hand, the first diode and, on the other, the second diode and the resistor, the first current proportional to temperature being formed by the current imposed in the resistor by the effect of the voltage variations proportional to temperature across the terminals of the second diode.

6. The circuit according to claim 2, wherein the diodes have different active areas.

7. The circuit according to claim 1, wherein the second stage comprises a feedback circuit to control a voltage across the terminals of a third resistor with respect to a voltage across the terminals of a third diode relative to the substrate voltage, the second current inversely proportional to temperature being formed by a current flowing through the third resistor.

8. The circuit according to claim 7, wherein the first and the second currents are sampled by means of a current mirror circuit.

9. The circuit according to claim 1, further comprising an auxiliary starter circuit for the first stage.

10. The circuit according to claims 1, further comprising a follower amplifier connected to an output of the circuit to sum.

11. A circuit comprising:

a current mirror circuit including a first and second branches connected between a reference voltage and a substrate voltage and through which substantially identical currents flow, each first and second branch including a diode, the diodes having differing area coefficients, the current mirror circuit producing a first output current which is a copy of the current mirror branch current;

a current source circuit including first and second branches connected between the reference voltage and the substrate voltage, the first branch including a diode and the second branch including a resistor, the current source circuit generating a current in the second branch that is dependent on a voltage across the diode and a value of the resistor, the current source circuit producing a second output current which is a copy of the second branch current; and a summing circuit to sum the first and second output currents;

wherein the current source circuit comprises a feedback circuit to control a voltage across the resistor in the second branch with respect to a voltage across the diode in the first branch relative to the substrate voltage.

12. The circuit of claim 11 wherein the first output current is proportional to temperature and the second current is inversely proportional to temperature.

13. The circuit of claim 11, wherein the feedback circuit comprises a comparator having a first input sensing the voltage across the resistor in the second branch and a second input sensing the voltage across the diode in the first branch relative to the substrate voltage.

14. A comprising:

a current mirror circuit including a first and second branches connected between a reference voltage and a substrate voltage and through which substantially identical currents flow, each first and second branch including a diode, the diodes having differing area coefficients, the current mirror circuit producing a first output current which is a copy of the current mirror branch current;

a current source circuit including first and second branches connected between the reference voltage and the substrate voltage, the first branch including a diode and the second branch including a resistor, the current source circuit generating a current in the second branch that is dependent on a voltage across the diode and a value of the resistor, the current source circuit producing a second output current which is a copy of the second branch current; and a summing circuit to sum the first and second output currents;

wherein the summing circuit comprises a resistor coupled between a summing node and a ground reference independent of the substrate voltage, the first and second output currents supplied to the summing node.

15. A circuit fabricated on a semiconductor substrate, comprising:

a first circuit coupled between a supply voltage and a substrate voltage, the first circuit operable to produce a first output current proportional to temperature and independent of the supply voltage and substrate voltage;

a second circuit coupled between the supply voltage and substrate voltage, the first circuit operable to produce a second output current inversely proportional to temperature and independent of the supply voltage and substrate voltage, wherein the second circuit comprises a current source circuit including first and second branches, the first branch including a diode and the second branch including a resistor, and further including a comparator having a first input sensing a voltage across the resistor, a second input sensing a voltage across the diode and an output controlling current in the second branch; and a summing circuit to sum the first and second output currents.

16. The circuit of claim 15 wherein the first circuit comprises a current mirror circuit including a first and second branches connected between the supply voltage and substrate voltage and through which substantially identical currents flow, each first and second branch including a diode, the diodes having differing area coefficients, the current mirror circuit producing the first output current which is a copy of the current mirror branch current.

17. The circuit of claim 15 wherein the current source circuit generates a current in the second branch that is dependent on the sensed voltage across the diode and the sensed voltage across the resistor, the current source circuit producing the second output current which is a copy of the second branch current.

18. A circuit fabricated on a semiconductor substrate, comprising:

a first circuit coupled between a supply voltage and a substrate voltage, the first circuit operable to produce a first output current proportional to temperature and independent of the supply voltage and substrate voltage;

a second circuit coupled between the supply voltage and substrate voltage, the first circuit operable to produce a second output current inversely proportional to temperature and independent of the supply voltage and substrate voltage; and a summing circuit to sum the first and second output currents;

wherein the summing circuit sums the first and second output currents in a resistor connected to a ground voltage distinct from and electrically independent of a ground of the first and second circuits formed by the substrate voltage.

* * * * *

UNITED STATES PATENT AND TRADEMARK OFFICE

CERTIFICATE OF CORRECTION

PATENT NO. : 7,388,418 B2
APPLICATION NO. : 11/337818
DATED : June 17, 2008
INVENTOR(S) : Marius Reffay It is certified that error appears in the above-identified patent and that said Letters Patent is hereby corrected as shown below:

At column 8, claim 14, line 10, add the word -- circuit -- so that the line reads -- A circuit comprising: --.

Signed and Sealed this
Second Day of August, 2011

David J. Kappos
*Director of the United States Patent and Trademark Office*